United States Patent
Yamano et al.

(10) Patent No.: US 8,253,229 B2
(45) Date of Patent: Aug. 28, 2012

(54) SEMICONDUCTOR PACKAGE AND STACKED LAYER TYPE SEMICONDUCTOR PACKAGE

(75) Inventors: Takaharu Yamano, Nagano (JP); Tsuyoshi Kobayashi, Nagano (JP)

(73) Assignee: Shinko Electric Industries Co., Ltd., Nagano-shi, Nagano (JP)

(*) Notice: Subject to any disclaimer, the term of this patent is extended or adjusted under 35 U.S.C. 154(b) by 0 days.

(21) Appl. No.: 11/976,249

(22) Filed: Oct. 23, 2007

(65) Prior Publication Data

US 2008/0290491 A1 Nov. 27, 2008

(30) Foreign Application Priority Data

Oct. 27, 2006 (JP) .............................. P.2006-292820

(51) Int. Cl.
H01L 23/02 (2006.01)
(52) U.S. Cl. ........ 257/686; 257/712; 257/713; 257/706; 257/E23.01; 438/108; 438/109; 438/25; 438/26
(58) Field of Classification Search .......... 257/712–713, 257/706, 723–724, 778, 796; 438/108–109, 438/15, 25–26, 122
See application file for complete search history.

(56) References Cited

U.S. PATENT DOCUMENTS

| 6,032,355 | A * | 3/2000 | Tseng et al. | 29/840 |
| 6,175,497 | B1 * | 1/2001 | Tseng et al. | 361/704 |
| 6,340,842 | B1 | 1/2002 | Nakamura | |
| 6,784,765 | B2 * | 8/2004 | Yamada et al. | 333/193 |
| 7,062,113 | B2 * | 6/2006 | Caccavale et al. | 385/14 |
| 7,070,207 | B2 * | 7/2006 | Asai | 285/14 |
| 7,250,329 | B2 | 7/2007 | Yamano et al. | |
| 2001/0048151 | A1 | 12/2001 | Chun | |
| 2002/0020916 | A1 * | 2/2002 | Ito | 257/734 |
| 2004/0173902 | A1 | 9/2004 | Kim et al. | |
| 2004/0178510 | A1 | 9/2004 | Sunohara et al. | |
| 2005/0062173 | A1 | 3/2005 | Vu et al. | |
| 2006/0102996 | A1 * | 5/2006 | Han et al. | 257/686 |
| 2006/0151870 | A1 * | 7/2006 | Nishiyama et al. | 257/700 |
| 2006/0231950 | A1 | 10/2006 | Yoon | |

FOREIGN PATENT DOCUMENTS

| EP | 1 259 103 A1 | 11/2002 |
| EP | 1 617 714 A1 | 1/2006 |
| EP | 1 734 581 A1 | 12/2006 |
| JP | 11-168150 | 6/1999 |
| JP | 2001-230515 | 8/2001 |
| JP | 2001-274324 A | 10/2001 |
| JP | 2004-247475 A | 9/2004 |
| JP | 2004-363351 | 12/2004 |
| JP | 2005-347229 | 12/2005 |
| JP | 2005-347299 | 12/2005 |

OTHER PUBLICATIONS

Introduction to microfabrication, Sami Franssila 2004, ISBN: 0-470-85105-8.*

* cited by examiner

*Primary Examiner* — Evan Pert
*Assistant Examiner* — Mark A Laurenzi
(74) *Attorney, Agent, or Firm* — Drinker Biddle & Reath LLP

(57) ABSTRACT

In a stacked layer type semiconductor package constructed by stacking a plurality of packages with each other, the plurality of packages include a semiconductor package including: a semiconductor chip; a substrate in which a concave portion has been formed, the semiconductor chip being mounted in the concave portion; and a wiring line structure constructed in such a manner that the wiring line structure can be externally connected to the semiconductor chip at least just above and just under the semiconductor chip.

10 Claims, 3 Drawing Sheets

SEMICONDUCTOR PACKAGE AND STACKED LAYER TYPE SEMICONDUCTOR PACKAGE

BACKGROUND OF THE INVENTION

The present invention is related to a semiconductor package constructed by mounting a semiconductor chip on a substrate, and a stacked layer type semiconductor package with employment of the above-described semiconductor package.

While various types of structures of packages for semiconductor chips have been proposed, since electronic appliances on which packages are mounted are manufactured with high performance, there are some cases that, for instance, stacked layer type packages (will also be referred to as "package-on-package (PoP)") made by stacking conventional packages with each other are employed.

While stacked layer type packages have such structures constructed in such a manner that plural pieces of packages containing semiconductor chips are stacked on each other, since various types of packages can be combined with each other, these stacked layer type packages can be easily adapted to high-performance electronic appliances manufactured in various specifications.

[Patent publication 1] JP-A-2005-347299

However, among current semiconductor chips, total numbers of connection terminals are increased in connection with high performance of these semiconductor chips, namely, a so-called "multiple pin" of semiconductor chips have been popularized. When packages are constructed which can be adapted to semiconductor chips manufactured with the above-described "multiple pins", total numbers of connection terminals employed in these packages are increased. As a result, there is such a problem that these packages can be hardly stacked with each other.

For example, when packages manufactured with so-called "multiple pins" are stacked with each other, areas used to electrically connect these packages with each other must be secured. As a result, there is another problem that stacked layer type packages become bulky. Further, since there is such a problem that thickness of the stacked layer type packages are increased, there is a further problem that these stacked layer packages can be hardly made thicker. As previously described, no concrete structural example has been proposed as to such stacked layer type packages capable of being adapted to the "multiple pins" and also capable of being made compact.

Further, in the above-described semiconductor chips having high performance and manufactured with the multiple pins, since heat generation amounts of the semiconductor chips are increased, there are some possibilities that various package failures may occur due to thermal cycles of the semiconductor chips.

For instance, general-purpose semiconductor chips are manufactured by silicon. As a result, there is a large difference in thermal expansion coefficients between the silicon and interposers. The interposers are made of resin materials employed in general-purpose packages.

As a consequence, when heat radiation and heat dissipation of the semiconductor chips are repeatedly performed, there is a risk that wire disconnections of packages occur and the packages are broken due to differences in the thermal expansion coefficients between the semiconductor chips and the interposers. Thus, there is another problem that reliability of these packages is lowered.

SUMMARY OF THE INVENTION

As a consequence, the present invention has a unified object to provide a semiconductor package and a stacked layer type semiconductor package, which can solve the above-described problems, and are novel and useful.

A concrete object of the present invention is to provide both a semiconductor package having superior reliability, which is made compact and slim, and also a stacked layer type semiconductor package having superior reliability, which is made compact and slim.

According to a first aspect of the present invention, the above-described problems are solved by a semiconductor package featured including:

a semiconductor chip;

a substrate provided with a concave portion in which the semiconductor chip is mounted; and a wiring line structure constructed in such a manner that the wiring line structure can be externally connected to the semiconductor chip at least just above and just under the semiconductor chip.

Further, according to a second aspect of the present invention, the above-described problems are solved by such a stacked layer type semiconductor package constructed by stacking a plurality of packages with each other, wherein the plurality of packages which is a semiconductor package, including:

a semiconductor chip;

a substrate provided with a concave portion in which the semiconductor chip is mounted; and a wiring line structure constructed in such a manner that the wiring line structure can be externally connected to the semiconductor chip at least just above and just under the semiconductor chip.

In accordance with the present invention, it is possible to provide the semiconductor package having superior reliability, which is made compact and slim, and also the stacked layer type semiconductor package having superior reliability, which is made compact and slim.

DETAILED DESCRIPTION OF THE PREFERRED EMBODIMENTS

Figure 1:
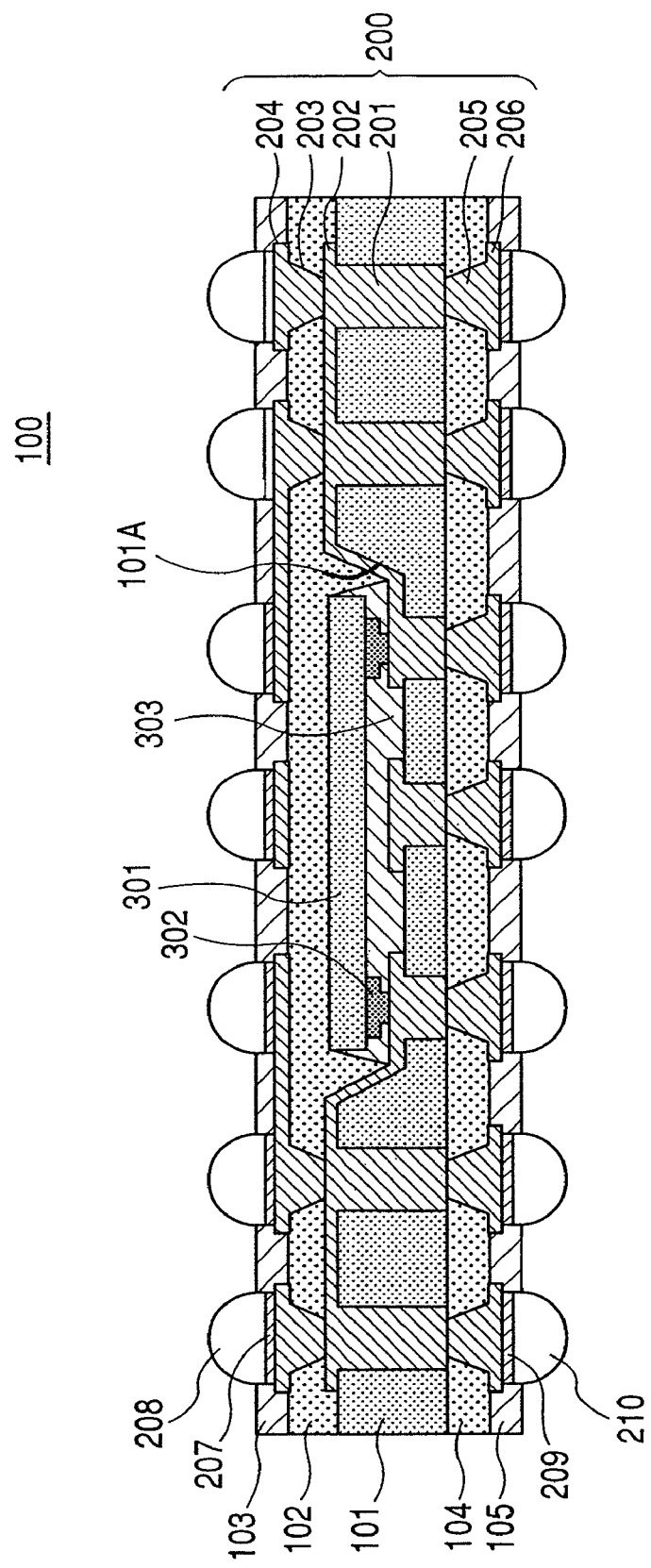
FIG. 1 is a diagram for indicating a semiconductor package according to an embodiment 1.

A semiconductor package, according to the present invention, is featured by including: a semiconductor chip; a substrate in which a concave portion has been formed, the semiconductor chip being mounted in the concave portion; and a wiring line structure constructed in such a manner that the wiring line structure can be externally connected to the semiconductor chip at least just above and just under the semiconductor chip.

In the above-described semiconductor package, the wiring line structure can be externally connected to the semiconductor chip at least at positions located just above and just under the semiconductor chip (external connection terminal is provided). For example, in the above-described semiconductor package, connection terminals can be arranged on both a first major plane and a second major plane in a so-called "full grid array" form. As a result, if the above-described semiconductor package is employed, then a stacked layer type semiconductor package can be made compact. Further, since the semiconductor chip has been mounted in the concave portion of the silicon substrate in the above-described semiconductor package, a semiconductor package (stacked layer type semiconductor package) can be made slim.

In other words, since the above-described semiconductor package is employed, such a stacked layer type semiconductor package can be constructed in a compact and slim size, and can be adapted to a device having high performance (typically known as semiconductor chip having multiple pins) and also a mobile appliance.

Further, in the above-described semiconductor package, a silicon substrate may be preferably employed as the substrate in which the concave portion for mounting the semiconductor chip has been formed. For example, as to the previously explained semiconductor chip having high performance, there are some cases that a heat radiation amount thereof is increased. As a result, in such a package with employment of a substrate (interposer) made of the conventional resin material, there is such a risk that problems may occur, namely, wiring lines of the package are disconnected, or are damaged due to a difference in thermal expansion coefficients between silicon for constructing the semiconductor chip and the resin material for constructing the substrate.

On the other hand, in the above-described semiconductor package according to the present invention, since there is substantially no difference in thermal expansion coefficients between the semiconductor chip and the substrate, there is such an advantage that reliability can become superior in such a case that a semiconductor chip having high performance is mounted which is typically known as a semiconductor chip equipped with multiple pins.

Further, as the material for constructing the above-described substrate, for example, glass and ceramics may be alternatively employed. For instance, since compositions of glass and ceramics are adjusted, thermal expansion coefficients thereof may be approximated to that of the semiconductor chip (silicon).

Next, a concrete description is made of a structural example with respect to the above-explained semiconductor package and the above-explained stacked layer type semiconductor package using the semiconductor package with reference to drawings.

Embodiment 1

FIG. 1 is a sectional view for schematically indicating a semiconductor package 100 according to an embodiment 1 of the present invention. Referring now to FIG. 1, the semiconductor package 100 according to the embodiment 1 has been schematically manufactured by that a concave portion 101A is formed in a substrate 101 made of silicon, and a semiconductor chip 301 mounted in such a manner that this chip 301 is stored in the concave portion 101A.

Further, in the semiconductor package 100, a wiring line structure 200 has been formed in such a manner that on the side of a first major plane (namely, major plane located on opening side of concave portion 101A) and on the side of a second major plane (namely, major plane located on opposite side with respect to opening side of concave portion 101A), the wiring line structure 200 can be externally connected to the semiconductor chip 301. For example, a plurality of external connection terminals (bumps) 208 and 210 to be formed on the wiring line structure 200 have been arranged on the first major plane and the second major plane, respectively.

The above-described external connection terminals 208 and 210 have been arrayed in an array shape as viewed from the plane, namely in a so-termed "full grid array shape." In other words, the above-described wiring line structure 200 has been manufactured in accordance with the following feature point: the wiring line structure 200 can be externally connected to the semiconductor chip 301 not only at peripheral portions of the first major plane and the second major plane, but also at least at portions located just above and just under the semiconductor chip 301.

For instance, the above-described wiring line structure 200 has such a structure that while the wiring line structure 200 has via plugs 201 penetrated through the substrate 101, both via plugs and pattern wiring lines for connecting the via plugs 201 to the external terminals 208 and 210 have been formed in/on both planes of the substrate 101, respectively.

For instance, a pattern wiring line 202 which is connected to the via plugs 201 has been formed on the front plane side (namely, side on which semiconductor chip 301 has been mounted) of the substrate 101, and an insulating layer 102 has been formed on this front plane side in such a manner that the insulating layer 102 covers the pattern wiring line 202. Furthermore, via plugs 203 have been formed in such a manner that these via plugs 203 penetrate through the insulating layer 102, and a pattern wiring line (electrode pad) 204 which is connected to the via plugs 203 has been formed on the insulating layer 102.

Further, the external connection terminals (solder bumps) 208 have been formed on the pattern wiring line 204, while the external connection terminals 208 have been arrayed in the full grid array in such a manner that the arrangements of these external connection terminal 208 become the grid shape, as viewed from the plane. Further, if necessary, a connection layer 207 has been formed between the external connection terminals 208 and the pattern wiring line 204. The connection layer 207 is made of, for instance, Au/Ni (stacked layer structure made of Au layer and Ni layer in such a manner that Au is located on side of external connection terminals). Moreover, a solder resist layer 103 has been formed around the external connection terminals 208 in such a manner that the solder resist layer 103 covers a portion of the insulating layer 102 and a portion of the pattern wiring line 204.

Further, an insulating layer 104 has been formed on the side of the rear plane of the substrate 101 (namely, opposite side as to side where semiconductor chip 301 is mounted). In addition, via plugs 205 which are connected to the via plugs 201 are formed in such a manner that these via plugs 205 penetrate through the insulating layer 104, and also, a pattern wiring line (electrode pad) 206 which is connected to the via plugs 205 has been formed on the insulating layer 104.

Further, as previously described, the external connection terminals (solder bumps) 210 have been formed on the pattern wiring line 206, while the external connection terminals 210 have been arrayed in the full grid array in such a manner that the arrangements of these external connection terminal 210 become the grid shape, as viewed from the plane. Further, if necessary, a connection layer 209 has been formed between the external connection terminals 210 and the pattern wiring line 206. The connection layer 209 is made of, for instance, Au/Ni (stacked layer structure made of Au layer and Ni layer in such a manner that Au is located on side of external connection terminals). Moreover, a solder resist layer 105 has been formed around the external connection terminals 210 in such a manner that the solder resist layer 105 covers a portion of the insulating layer 104 and a portion of the pattern wiring line 206.

In the above-described structure, the insulating layers 102 and 104 are formed of such a material, for example, an epoxy-series resin material is employed as a major material which is called as a "build-up" material. Further, the wiring line structure 200 (constructed of via plugs 201, 203, 205, and pattern wiring lines 202, 204, 206) is made of, for example, Cu. However, the above-described material is one example, and thus, the present invention is not limited only to these materials.

The semiconductor chip 301 has been mounted in the concave portion 101A under such a condition that the device plane thereof is directed to a lower direction (bottom plane side of concave portion 101A), namely under a so-called "face down" condition. Bumps 302 connected to electrode pads (not shown) formed on the device plane of the semiconductor chip 301 have been connected to the pattern wiring line 202, and an under fill resin (resin material) 303 has been filled between the semiconductor chip 301 and the substrate 101.

The via plugs 201 which constitute the above-described wiring line structure 200 are formed in a substantially entire plane of the silicon substrate 101 as viewed in the plane, for example, are formed in both such a portion at the bottom portion of the concave portion 101A, the silicon thickness of which is thin, and another portion around the concave portion 101A, the silicon thickness of which is thick.

Further, the pattern wiring line 202 which is connected to the via plugs 201 and the semiconductor chip 301 (bumps 302) has been formed by containing, for example, such a portion which is formed on a side wall surface of the concave portion 101A. For instance, the pattern wiring line 202 has been connected to both the via plugs 201 and the semiconductor chip 301 (bumps 302) on the bottom plane of the concave portion 101A. Further, the pattern wiring line 202 has been formed from the bottom plane of the concave portion 101A to the side wall surface of the concave portion 101A along the inner wall plane of the concave portion 101A, and further, has been formed toward the outer side of the concave portion 101A in such a manner that the pattern wiring line 202 is elongated over the surface of the substrate 101.

On the other hand, the pattern wiring line 204 which is formed on the insulating layer 102 contains such a portion formed in such a manner that this portion is elongated from a portion which is located outside the concave portion to another portion (located just above semiconductor chip 301) which is overlapped with the concave portion 101A.

Since the wiring line structure 200 has been formed in the above-described manner, the external connection terminals 208 which are connected to the wiring line structure 200 can be manufactured on the substantially entire plane as to the first major plane, which contains the plane located just above the semiconductor chip 301, in such a manner that these external connection terminals 208 are arranged in the so-called "full grid array."

Further, in the above-described semiconductor package 100, the external connection terminals 210 which are connected to the wiring line structure 200 can be manufactured on the substantially entire plane as to the second major plane, which contains the plane located just under the semiconductor chip 301, in such a manner that these external connection terminals 210 are arranged in the so-called "full grid array." Further, if necessary, such a pattern wiring line which corresponds to the pattern wiring line 202 and is connected to the via plug 201 may be alternatively provided on the rear plane of the substrate 101.

Since the above-described semiconductor package 100 has been constructed in such a manner that the semiconductor chip 301 can be externally connected to the wiring line structure 200 just above and just under this semiconductor chip 301 (for example, has been arranged in full grid array), the semiconductor package 100 can be readily adapted to the multiple pins of the semiconductor chip 301 (namely, total number of bumps 302 is increased).

As a consequence, even in such a case that a semiconductor package is adapted to a semiconductor chip manufactured with multiple pins, an increasing amount of an area of the semiconductor package can be suppressed and the semiconductor package can have a compact structure. Furthermore, since the above-described semiconductor package is employed, a stacked layer type semiconductor package can be made compact. That is to say, in such a case that the above-described semiconductor packages are stacked with each other, since both planes (namely, first major plane and second major plane) are the full grid array, these semiconductor packages can be connected to each other in a higher efficiency under space saving condition.

Further, in the above-described semiconductor package 100, since the semiconductor chip 301 has been mounted in the concave portion 101A of the silicon substrate 101, the semiconductor package 100 (stacked layer type semiconductor package using semiconductor package 100) can be made slim.

In other words, since the above-described semiconductor package 100 is employed, this semiconductor package 100 can be adapted to such a device having higher performance which is typically known as the semiconductor chip 301 manufactured with the multiple pins, and furthermore, such a stacked layer type semiconductor package capable of accepting both slim and compact requirements (required in mobile appliance etc.) can be constructed.

Further, in the above-described semiconductor package 100, the substrate 101 is made of silicon, which may also constitute a feature. For instance, there are some cases that in a semiconductor chip having high performance and multiple pins (namely, semiconductor chip 301), a heat radiation amount thereof is increased. In order to solve such a large heat radiation problem, in the above-described semiconductor package 100, both the semiconductor chips 301 formed by employing silicon and the substrate 101 made of silicon have been constituted in such a manner that there is substantially no difference in the thermal expansion coefficients between the semiconductor chip 301 and the substrate 101. As a consequence, reliability in the case that a semiconductor chip having high performance which is typically known as a semiconductor chip manufactured with multiple pins is mounted may become superior.

Further, in the above-explained semiconductor package 100, the wiring line structure 200 is arranged in such a manner that an operation test for the semiconductor chip 301 can be accepted, so that the operation test for the semiconductor chip 301 can also be carried out. For example, in the case that a plurality of the semiconductor packages 100 are stacked with each other so as to construct a stacked layer type semiconductor package, operation tests for packages are individually carried out with respect to these plural semiconductor chips 301 before these semiconductor packages 100 are stacked with each other. As a result, a manufacturing yield of the resultant stacked layer type semiconductor package can be improved.

The above-described semiconductor package 100 can be manufactured in accordance with known manufacturing methods (for example, RIE (Reactive Ion Etching) method of silicon, forming of wiring line structure 200 by plating method etc.). Referring now to FIG. 1, manufacturing of the semiconductor package 100 will be schematically and simply explained.

In such a case that the above-described semiconductor package 100 is manufactured, both a structure corresponding to a concave portion 101A and through holes which penetrate through a substrate 101 are firstly formed in the substrate 101

(for example, silicon wafer etc.) made of silicon by an RIE (reactive ion etching) method. Furthermore, after a thermal oxide film (not shown in FIG. 1) has been formed so as to insulate the surface of the substrate 101, via plugs 201 which are made of Cu and are embedded in the through holes are formed by a plating method.

Next, a pattern wiring line 202 made of Cu is formed by a semi-additive method. In this case, a pattern wiring line may be alternatively formed also on the rear plane of the substrate 101, if necessary. Subsequently, bumps 302 (Au) of a semiconductor chip 301 are joined to the pattern wiring line 202 by applying ultrasonic waves, or by performing a heating method, and then, an under fill resin 303 (fluid resin) is filled between the semiconductor chip 301 and the substrate 101 (flip chip mounting).

Next, insulating layers 102 and 104 are formed on both planes of the substrate 101 respectively by laminating resin films at a vacuum atmosphere, and then, these formed insulating layers 102 and 104 are heated so as to be hardened. It should be noted that the insulating layers 102 and 104 may be alternatively formed by coating and heating resins. Moreover, after through holes are formed in the insulating layers 102 and 104 (desmear processing is further carried out, if necessary), via plugs 203 and 205, and pattern wiring lines 204 and 206 are formed by the semi-additive method.

Next, after solder resist layers 103 and 105 are formed, connection layers 207 and 209 are formed respectively on the pattern wiring lines 204 and 206 which are exposed from the solder resist layers 103 and 105 by performing, for example, a plating method, if required. Subsequently, external connection terminals 208 and 210 made of solder bumps are formed on the connection layers 207 and 209 (on pattern wiring lines 204 and 206). Thereafter, the substrate 101 (silicon wafer) is diced, so that individual semiconductor packages 100 can be manufactured.

Embodiment 2

Figure 2:
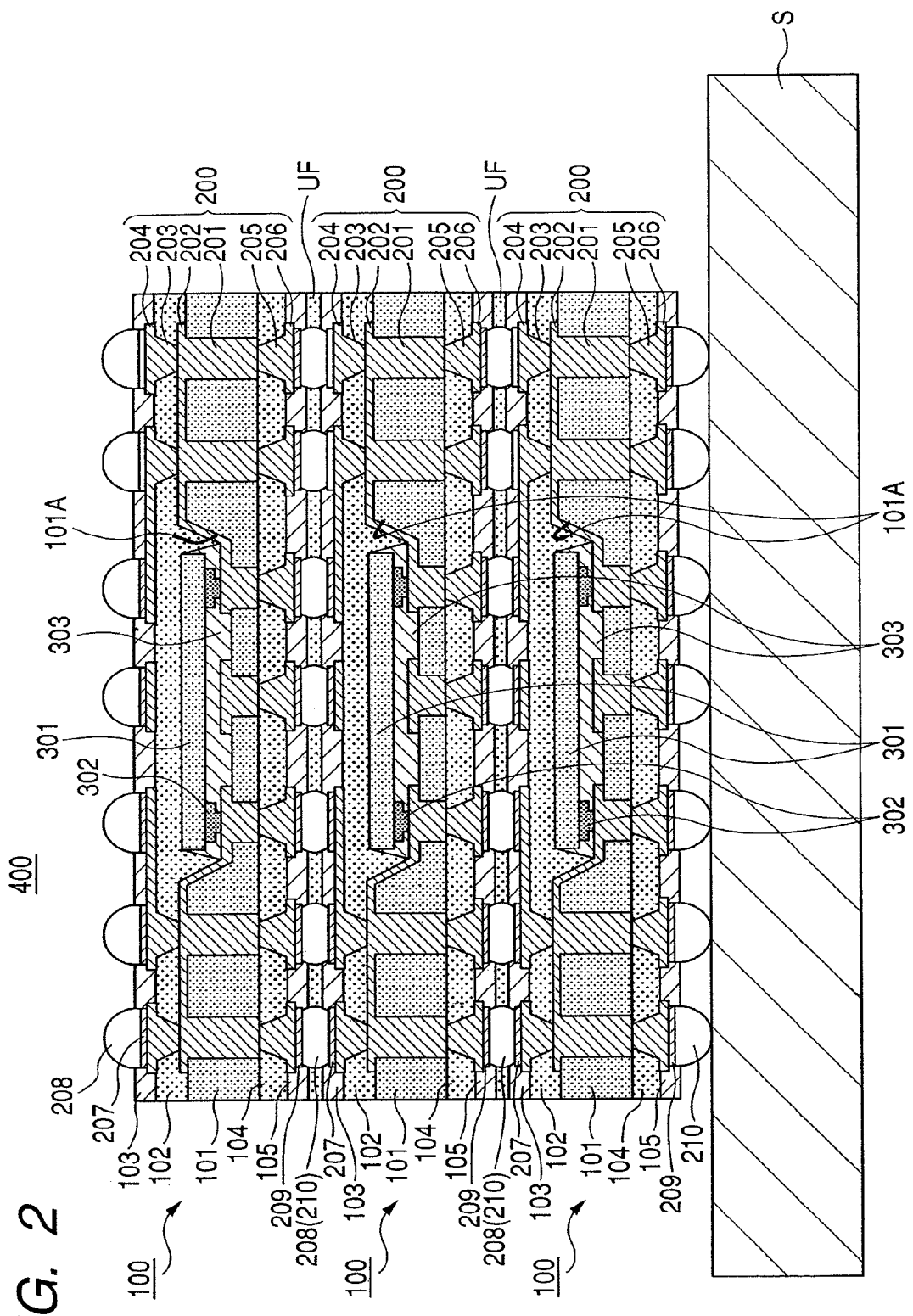
FIG. 2 is a diagram for showing a stacked layer type semiconductor package according to an embodiment 2.

FIG. 2 is a diagram for showing a stacked layer type semiconductor package 400 manufactured by employing the semiconductor package 100 formed according to the embodiment 1. It should be noted that the same reference numerals shown in the previous embodiment 1 will be employed as those for denoting the same structural elements, and descriptions thereof will be omitted.

Referring now to FIG. 2, the stacked layer type semiconductor package 400, according to this embodiment 2 of the present invention, has been manufactured by stacking 3 pieces of the above-described semiconductor packages 100 formed according to the embodiment 1 with each other. Although insulating layers UF (Under Fill resin) have been formed among the semiconductor packages 100 to be stacked each other, into which fluid resins have been filled and hardened, these insulating layers UF may be omitted. Alternatively, the insulating layers UF may be formed by mounting resin films among packages when the packages are stacked with each other.

In the above-described structure, an external connection terminal 210 of the semiconductor package 100 located at the lowermost layer has been connected to a mother board S. Further, for example, other semiconductor chips, or electronic components (surface packaging components) such as a capacitor, a resistor, and an inductor may be mounted on a pattern wiring line 204 (connection layer 207) of the semiconductor package 100 located at the uppermost layer. Further, the external connection terminal 208 of the semiconductor package 100 provided at the uppermost layer may be omitted from the stacked layer type semiconductor package 400.

As previously described, since the semiconductor packages 100 manufactured according to the embodiment 1 are employed, it is possible to construct a compact and slim stacked layer type semiconductor package having superior reliability.

Further, a total number of packages to be stacked with each other is not limited only to 3 pieces. For example, a total number of the semiconductor packages 100 to be stacked with each other may be selected to be 2. Alternatively, a total quantity of the semiconductor packages 100 to be stacked with each other may be selected to be 4, or more pieces.

Embodiment 3

Figure 3:
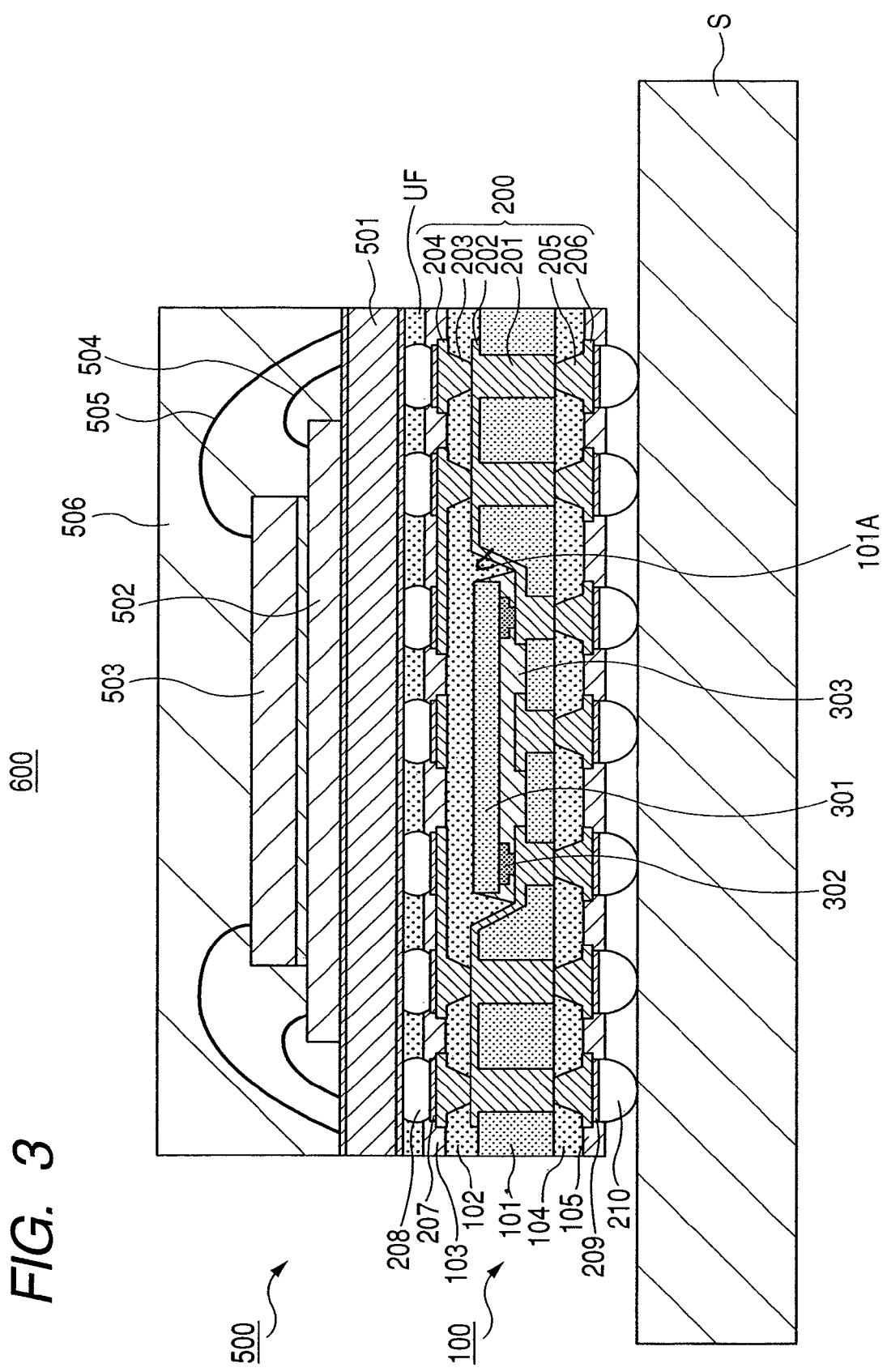
FIG. 3 is a diagram for showing a stacked layer type semiconductor package according to an embodiment 3.

FIG. 3 is a diagram showing a stacked layer type semiconductor package 600 manufactured by employing the semiconductor package 100 formed according to the embodiment 1. It should be noted that the same reference numerals shown in the previous embodiment 1 will be employed as those for denoting the same structural elements, and descriptions thereof will be omitted.

Referring to FIG. 3, the stacked layer type semiconductor package 600 according to the embodiment 3 has been constructed by stacking a semiconductor package 500 which is different from the semiconductor package 100 on the above-described semiconductor package 100 according to the embodiment 1.

The above-described semiconductor package 500 has a so-called "F-BGA" structure, namely, such a structure that semiconductor chips 502 and 503 have been stacked on an interposer 501. Further, while the semiconductor chips 502 and 503 have been electrically connected to the interposer 501 by wires 504 and 505 respectively, these semiconductor chips 502 and 503 have been sealed on the interposer 501 by a molding resin 506.

Alternatively, the above-explained structure may be changed into another structure in which the semiconductor chip 502 is flip-chip-connected to the interposer 501, and the semiconductor chip 503 mounted on a rear plane (upper plane) of the semiconductor chip 502 is connected to the interposer 501 by a wire.

As previously described, as a package which is stacked on the semiconductor package 100 according to the embodiment 1, such package having various structures and various arrangements may be selected.

While the present invention has been described with reference to the preferred embodiments, the present invention is not limited only to the above-described specific embodiments, but may be modified and changed in various manners within the gist described in the scope of claims.

For example, a plurality of semiconductor chips (for instance, stacked type semiconductor chips) to be mounted in the concave portion 101A may be alternatively employed. Further, while a plurality of concave portions 101A may be alternatively formed in the substrate 101, a plurality of semiconductor chips may be alternatively mounted.

In accordance with the present invention, it is possible to provide the semiconductor package having superior reliability, which is made compact and slim, and also the stacked layer type semiconductor package having superior reliability, which is made compact and slim.

What is claimed is:

1. A stacked layer type semiconductor package including a plurality of stacked semiconductor packages, each of the semiconductor packages comprising:
   a semiconductor chip;
   a substrate having a first surface provided with a concave portion in which the semiconductor chip is mounted in a face down condition, and a second surface opposite the first surface, the concave portion including a bottom surface and a sidewall surface extending from the bottom surface to the first surface of the substrate; and
   a wiring line structure constructed in such a manner that the wiring line structure externally connects to the semiconductor chip at least just above and just under the semiconductor chip,
   wherein the wiring line structure includes:
   a first pattern wiring line formed on the first surface of the substrate, the sidewall surface of the concave portion from the first surface of the substrate to the bottom surface of the concave portion, and the bottom surface of the concave portion, and connected with the semiconductor chip,
   a first insulating layer formed on the first surface of the substrate covering the concave portion and the semiconductor chip,
   a second insulating layer formed on the second surface of the substrate, and
   a second pattern wiring line formed on the second insulating layer and connected with the first pattern wiring line, and a third pattern wiring line formed on the first insulating layer and connected with the first pattern wiring line.

2. The stacked layer type semiconductor package as claimed in claim 1, wherein the first pattern wiring line contains a via plug which penetrates through a bottom portion of the concave portion of the substrate.

3. The stacked layer type semiconductor package as claimed in claim 1, wherein the semiconductor chip and the substrate have a substantially equal thermal expansion coefficient.

4. The stacked layer type semiconductor package as claimed in claim 1, wherein a sidewall of the concave portion is inclined with respect to the first surface of the substrate.

5. The stacked layer type semiconductor package as claimed in claim 1, wherein the substrate has a via plug therethrough, which connects the first pattern wiring line and the second pattern wiring line.

6. A semiconductor package comprising:
   a semiconductor chip;
   a substrate having a first surface provided with a concave portion in which the semiconductor chip is mounted in a face down condition, and a second surface opposite the first surface, the concave portion including a bottom surface and a sidewall surface extending from the bottom surface to the first surface of the substrate; and
   a wiring line structure constructed in such a manner that the wiring line structure externally connects to the semiconductor chip at least just above and just under the semiconductor chip,
   wherein the wiring line structure includes:
   a first pattern wiring line that extends from the first surface of the substrate to the bottom surface of the concave portion through the side wall surface of the concave, portion such that the first pattern wiring line is formed on the first surface of the substrate, the sidewall surface of the concave portion from the first surface of the substrate to the bottom surface of the concave portion, and the bottom surface of the concave portion, and connected with the semiconductor chip,
   a first insulating layer formed on the first surface of the substrate covering the concave portion and the semiconductor chip,
   a second insulating layer formed on the second surface of the substrate, and
   a second pattern wiring line formed on the second insulating layer and connected with the first pattern wiring line, and a third pattern wiring line formed on the first insulating layer and connected with the first pattern wiring line such that the first pattern wiring line contacts the third pattern wiring line.

7. The semiconductor package as claimed in claim 6, wherein the first pattern wiring line contains a via plug which penetrates through a bottom portion of the concave portion of the substrate.

8. The semiconductor package as claimed in claim 6, wherein the semiconductor chip and the substrate have a substantially equal thermal expansion coefficient.

9. The semiconductor package as claimed in claim 6, wherein a sidewall of the concave portion is inclined with respect to the first surface of the substrate.

10. The semiconductor package as claimed in claim 6, wherein the substrate has a via plug therethrough, which connects the first pattern wiring line and the second pattern wiring line.

* * * * *